(12) United States Patent
Struder et al.

(10) Patent No.: US 7,238,949 B2
(45) Date of Patent: Jul. 3, 2007

(54) CONDUCTOR CROSSOVER FOR A SEMICONDUCTOR DETECTOR

(75) Inventors: Lothar Struder, Munich (DE); Gerhard Lutz, Munich (DE); Rainer Richter, Munich (DE)

(73) Assignee: Max-Planck-Gesellschaft zur Forderung der Wissenschaften E.V., Munich (DE)

( * ) Notice: Subject to any disclaimer, the term of this patent is extended or adjusted under 35 U.S.C. 154(b) by 92 days.

(21) Appl. No.: 10/509,320

(22) PCT Filed: Mar. 27, 2003

(86) PCT No.: PCT/EP03/03209

§ 371 (c)(1),
(2), (4) Date: Apr. 26, 2005

(87) PCT Pub. No.: WO03/081637

PCT Pub. Date: Oct. 2, 2003

(65) Prior Publication Data

US 2005/0173733 A1   Aug. 11, 2005

(30) Foreign Application Priority Data

Mar. 27, 2002   (DE) ............... 102 13 812

(51) Int. Cl.
*G01T 1/20* (2006.01)
*H01L 27/10* (2006.01)

(52) U.S. Cl. .............. 250/370.1; 250/370.01; 250/370.07; 250/370.14

(58) Field of Classification Search .......... 250/370.1, 250/370.14, 370.07, 370.01
See application file for complete search history.

(56) References Cited

U.S. PATENT DOCUMENTS 4,283,485 A * 8/1981 Muenz et al. ............... 430/314

(Continued)

FOREIGN PATENT DOCUMENTS

DE           3427 476 A1      10/1985

OTHER PUBLICATIONS

Struder, L., "High-resolution imaging X-ray spectrometers", Nuclear Instruments & Methods in Physics Research . . . , Nov. 2000, pp. 73-113, vol. 454, No. 1, Amsterdam, NL.

(Continued)

*Primary Examiner*—Albert Gagliardi
(74) *Attorney, Agent, or Firm*—Gallagher & Kennedy, PC; Thomas D. MacBlain (57) ABSTRACT

The invention relates to a conductor crossover for a semiconductor detector, particularly for a drift detector for conducting X-ray spectroscopy. The conductor crossover comprises at least two doped semiconductor electrodes (2), which are placed inside a semiconductor substrate (1), at least one connecting conductor (M), which is guided over the semiconductor electrodes (2), and a first insulating layer (Ox). An intermediate electrode (L) is situated between the connecting conductor (M) and the first insulation layer (Ox). Said intermediate electrode overlaps the area of the semiconductor substrate (1) between the semiconductor electrodes (2) and is electrically insulated from the connecting conductor (M) by at least one additional insulation layer (I). The invention also relates to a drift detector equipped with a conductor crossover of this type and to a detector arrangement for conducting X-ray spectroscopy.

23 Claims, 4 Drawing Sheets

U.S. PATENT DOCUMENTS

| | | | |
|---|---|---|---|
| 4,729,005 A | | 3/1988 | Wei et al. |
| 4,885,620 A | * | 12/1989 | Kemmer et al. ............ 257/428 |
| 6,037,595 A | * | 3/2000 | Lingren ................. 250/370.01 |
| 6,455,858 B1 | * | 9/2002 | Patt et al. .............. 250/370.14 |
| 6,521,894 B1 | * | 2/2003 | Iwanczyk et al. ...... 250/370.11 |
| 2002/0139970 A1 | * | 10/2002 | Iwanczyk et al. ............. 257/21 |

OTHER PUBLICATIONS

Misiakos, et al., "A silicon drift detector with a P-type JFET integrated in the N-well anode", Nuclear Instruments . . . , 2001, pp. 422-426, vol. 458.

Castoldi, et al., "The controlled-drift detector", Nuclear Instruments and Methods in Physics Research, 2000, pp. 519-528, vol. 439.

* cited by examiner

CONDUCTOR CROSSOVER FOR A SEMICONDUCTOR DETECTOR

CROSS REFERENCE TO RELATED APPLICATIONS

This application is a National Stage application of international application No. PCT/EP03/03209 filed on Mar. 27, 2003 in the European Receiving Office, priority from which is here claimed.

BACKGROUND OF THE INVENTION

Semiconductor detectors for detecting electromagnetic radiation are based on the measurement of free charge carriers which are generated by the radiation in a semiconductor component. The charge carriers produce an electrical signal, which is conducted over at least one connecting conductor to a measuring device. The design of the connecting conductor represents a general problem in the production of semiconductors. The detector together with the connecting conductor must be practicable to manufacture and easy to handle, but must also not impair the detector function via the connecting conductor.

There are, for example, semiconductor detectors for locally resolved radiation detection which have multiple semiconductor electrodes situated in a semiconductor substrate (known as strip or track detectors). In these detectors, insulated connecting conductors are guided directly over the semiconductor electrodes to a substrate edge. However, such a conductor crossover is possible only when there is no interfering difference of potential between the connecting conductor and the semiconductor electrodes.

Drift detectors are known for high-resolution radiation detection in the field of X-ray spectroscopy (see L. Strüder in "Nuclear Instruments and Methods in Physics Research A," Vol. 454, 2000, pp. 73-113, and DE 34 27 476 A1, for example). A drift detector comprises, for example, a semiconductor substrate made of weakly n-doped silicon which has a strongly n-doped, centrally located anode on one surface (top side), and has a reverse contact made of a strongly p-doped semiconductor material on the opposite surface (bottom side). Annular semiconductor electrodes made of a strongly p-doped semiconductor material, concentrically arranged about the anode are also provided on the top side. The semiconductor electrodes are each kept at a fixed electrical potential which becomes increasingly negative as the distance from the anode increases. In the effective region of the electrodes this results in total depletion of the semiconductor substrate, and also produces an electrical drift field in the semiconductor substrate. Radiation interactions cause free electrons to be generated in the semiconductor substrate which are driven through the drift field to the anode, so that the electrical signal at the anode is a measure of the energy and/or intensity of the radiation.

The design of the connecting conductor to the anode has thus far represented a significant problem in the drift detectors. On account of the large differences in potential between the connecting conductor and the semiconductor substrate together with the semiconductor electrodes, the above-referenced guiding of the connecting conductor over the semiconductor electrodes would lead to erroneous signals caused by undesired charge carrier amplification, and/or to electrical breakthroughs. The known silicon drift detectors are thus characterized by a freely guided contacting of the anode from the top side of the semiconductor substrate to the outside. Electrical connecting conductors are guided from the anode to a spatially separate connector unit or measuring device through the half-space adjoining the top side.

The free guiding of connecting conductors has several disadvantages. The electrical contacting is difficult since the connecting conductors are typically attached by ultrasound bonding, whereby the semiconductor substrate tends to undergo undesired mechanical vibrations. As a result, faulty contacting may occur. Damage in the sensitive region of the semiconductor substrate upon bonding may cause the detector to fail. Furthermore, the free guiding of connecting conductors has disadvantages with regard to the stability of the contacting and the combination of drift detectors in groups.

SUMMARY OF THE INVENTION

An object of the invention is to provide an improved conductor crossover for a semiconductor detector which eliminates the disadvantages of conventional conductor crossovers and which may in particular be used when there are large differences in potential between a connecting conductor and semiconductor electrodes, which occur for example in the drift detector described above.

A basic concept of the invention is to provide a conductor crossover for a semiconductor detector having a semiconductor substrate and semiconductor electrodes, whereby the conductor crossover is used to guide at least one connecting conductor away from, for example, a signal-emitting readout electrode to a measuring device via the semiconductor electrodes and the semiconductor substrate, or via at least one adjacent detector, and at least one intermediate electrode is situated between the connecting conductor and the semiconductor substrate. The intermediate electrode is electrically insulated relative to the connecting conductor and the adjoining semiconductor substrate, and electrically shields at least one partial region of the semiconductor substrate between the semiconductor electrodes from the connecting conductor.

The provision of the intermediate electrode results in a number of advantages. The intermediate electrode may be kept at a specified electrical potential, thereby avoiding disturbances of the detector function by the potential of the connecting conductor. The limitations of conventional conductor crossovers to small differences in potential may be overcome in an advantageous manner. The electrical connection of the connecting conductor to a measuring device by bonding may take place in the non-sensitive region of the detector at the edge of the semiconductor substrate, at a distance from the anode. This simplifies the contacting and prevents detector failures resulting from substrate damage.

According to one advantageous embodiment of the invention, the intermediate electrode for electrical shielding of the semiconductor substrate completely overlaps the intermediate space between adjoining semiconductor electrodes. The width of the intermediate electrode is preferably greater than the lateral distance between adjoining semiconductor electrodes. To simplify the component structure with a single intermediate electrode, multiple intermediate spaces between adjoining semiconductor electrodes may be overlapped. Alternatively, it is possible for the intermediate electrode to have two or more parts, and to shield only one particular partial region of the intermediate space between the adjoining semiconductor electrodes. Preferably, the intermediate electrode shields the crossover between the semiconductor substrate and a semiconductor electrode with its individual parts.

The electrical potential of the intermediate electrode preferably is determined by electrically connecting this electrode to one of the adjoining semiconductor electrodes, thereby keeping the difference in potential between the intermediate electrode and the adjoining semiconductor electrodes low. Alternatively, the potential of the intermediate electrode may be determined by connecting the intermediate electrode to an external power source.

The intermediate electrode is composed of an electrically conductive material such as metal, an intrinsic or doped semiconductor, or a resistor material, for example. Preferably, no particular demands are placed on the conductivity of the intermediate electrode and optionally the electrical connection of the intermediate electrode to one of the semiconductor electrodes, since the intermediate electrode is used solely for electrostatic shielding. A poorly conductive compound may be provided, since there is no need for the intermediate electrode to conduct electrical power. For example, an intermediate electrode made of polysilicon may be connected directly to one of the semiconductor elements made of silicon. The direct polysilicon-silicon crossover, which is otherwise avoided in semiconductor elements, simplifies the design of the detector according to the invention.

According to a further advantageous embodiment of the invention, in order to improve the electrical shielding, multiple levels may be provided with intermediate electrodes placed one on top of the other, the individual levels being insulated from one another by additional insulation layers. Such a multilayer arrangement of the intermediate electrodes is particularly advantageous when the difference in potential between the connecting conductor and the semiconductor electrodes is very large (in the kV range, for example).

In one advantageous variant of the invention, at least one shielding electrode having a fixed electrical potential is also provided which is situated between the connecting conductor and the semiconductor substrate. When the signal-emitting readout electrode (anode) is centrally positioned on the semiconductor substrate, the shielding electrode (at least one) is preferably situated on the outer edge of the semiconductor substrate. To improve the electrical shielding, multiple shielding electrodes may be provided, each having a fixed electrical potential.

Guiding of the connecting conductor according to the invention is not limited to the contacting of the readout electrode, but may also be similarly used for contacting the individual semiconductor electrodes. In this manner all connecting conductors for the readout electrodes as well as for the semiconductor electrodes may be guided outward, thus enabling simple and mechanically secure contacting. If the readout electrode is integrated together with an amplifier element (a transistor, for example) onto the semiconductor substrate, the conductor crossover according to the invention may also be used for connecting the amplifier element, for example, for the connector contacts of the transistor. Multiple connecting conductors may be shielded with one intermediate electrode.

The invention is not limited to specific doping ratios in the detector. For example, a weakly n-doped semiconductor substrate with strongly p-doped semiconductor electrodes and a readout electrode of strongly n-doped semiconductor material, or conversely, a weakly p-doped semiconductor substrate with strongly n-doped semiconductor electrodes and a strongly p-doped readout electrode, may be provided.

In an X-ray drift detector, the semiconductor substrate should be so weakly doped that it is fully depleted in normal operation so that no free charge carriers are present in the non-irradiated semiconductor substrate. Correspondingly, the semiconductor electrodes and the readout electrode should be made of a material that is so strongly doped that full depletion does not occur in normal operation.

The conversion according to the invention is not limited to the use of silicon or polysilicon as semiconductor material. Rather, the individual semiconductor components may also be produced from other materials, for example germanium or gallium-arsenide. The use of silicon as semiconductor material, however, offers the advantage of economical availability and a fully developed technology.

According to a further advantageous embodiment of the invention, the at least one connecting conductor is guided over semiconductor electrodes which have an annular topology. An annular topology is formed, for example, by electrodes that are circular, oval, or polygonal, or that run in a non-concentrically closed manner. Multiple semiconductor electrodes which mutually enclose one another may be provided.

An additional advantage of the conductor crossover according to the invention concerns the combination of semiconductor detectors in groups. Large-surface detector assemblies or arrays, for example having numerous honeycomb-shaped adjoining drift detectors, may be more easily contacted, since the connecting conductors comprising multiple drift detectors are guided at the edge of the detector assembly and may be contacted there. Connecting conductors may be guided not only via one drift detector at its edge, but also may be guided via a plurality of detectors without impairing their function. In addition, guiding the connecting conductors according to the invention allows a closely stacked arrangement of multiple drift detectors above one another without interfering scattering or absorption material being situated between the individual drift detectors.

For a detector array, each semiconductor substrate preferably has the shape of a hexagonal disk, thus enabling numerous detectors to be adjacently positioned next to one another without gaps. The semiconductor electrodes preferably run in a manner corresponding to a hexagonal ring. The hexagonal shape is the preferred polygonal shape which most closely approximates a circular surface, thereby providing a large detector surface and also enabling a closely packed arrangement on one level, without overlapping. The monolithic integration of numerous hexagonal drift detectors on one wafer is particularly advantageous.

Alternatively, it is possible for the semiconductor substrate to have the shape of a circular disk, whereby the semiconductor electrodes preferably have an annular shape. Lastly, it is also possible for the individual semiconductor electrodes to have a linear arrangement and to run parallel to one another, the readout electrode then preferably being situated next to the semiconductor electrodes.

Further advantageous refinements of the invention are characterized in the subclaims, or are explained in greater detail below along with the description of the preferred embodiment examples with reference to the drawings.

DETAILED DESCRIPTION

Figure 1:
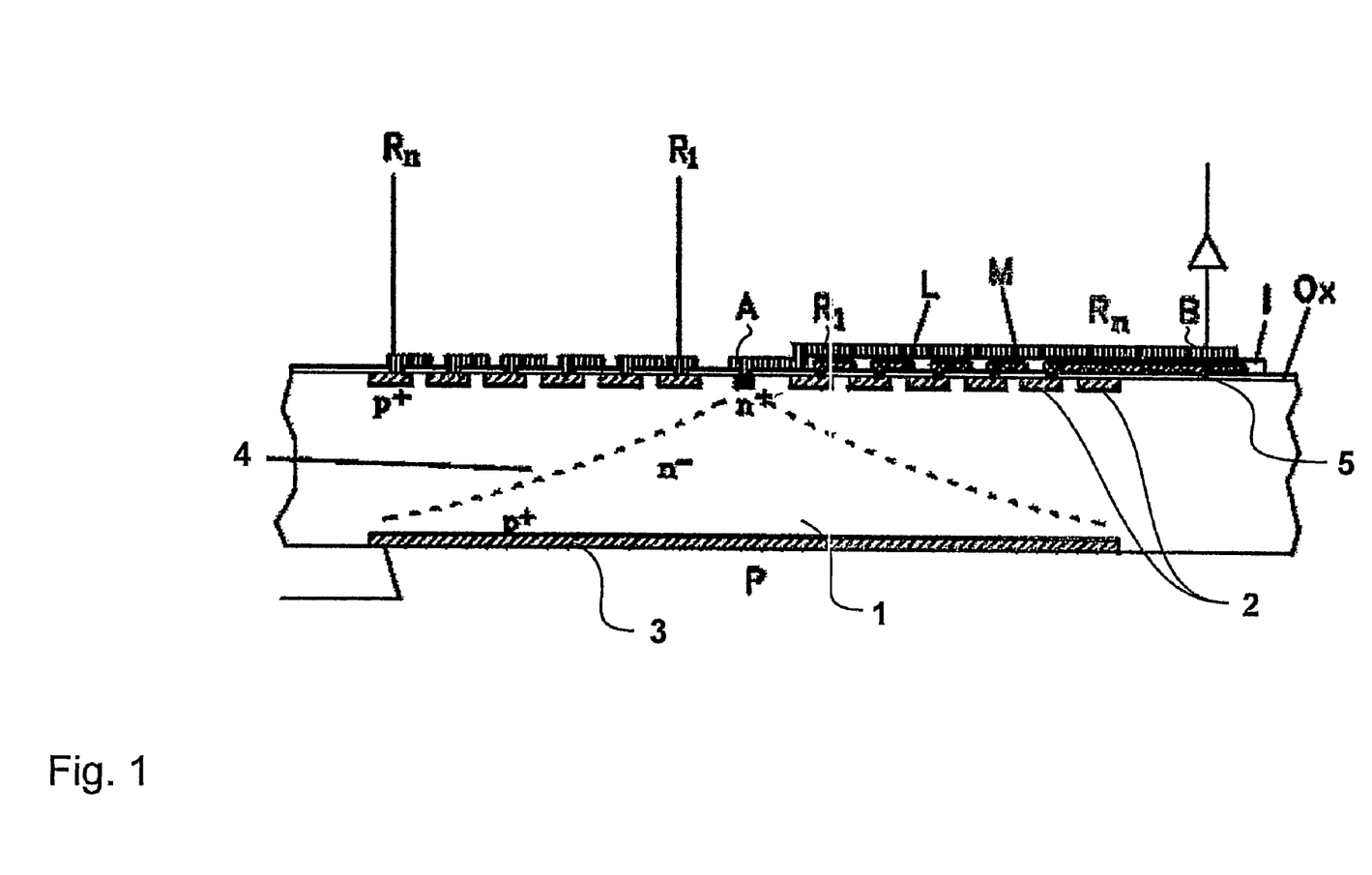
FIG. 1 shows a cross-sectional illustration of a drift detector with a first exemplary embodiment of a conductor crossover according to the invention.

FIG. 1 shows a silicon drift detector in an enlarged cross-sectional view, which may be used in X-ray spectroscopy, for example. The cylindrical drift detector comprises a semiconductor substrate 1, on the surface of which doped regions form semiconductor electrodes 2, 3, and A. Radiation detection is performed by the detection of electrons which are released by the radiation in the semiconductor substrate 1, the semiconductor electrodes interacting in a manner known as such, as described for example by L. Strüder in the above-referenced publication. The semiconductor substrate 1 comprises an n-doped silicon disk, the doping being so weak that the semiconductor substrate 1 is totally depleted in the sensitive region. The semiconductor substrate 1 has, for example, a thickness of approximately 300 μm and a diameter of several mm, depending on the application, such as approximately 2.5 mm, or up to several cm, for example 10 cm.

The readout electrode A, which is made out of an n-doped semiconductor material, is centrally positioned on the top side of the semiconductor substrate 1 (with reference to FIG. 1). The doping of the readout electrode A is so strong that total depletion does not occur during operation. The low capacitance of the readout electrode A in the illustrated arrangement is advantageous, so that even radiation having low energy and short duration of effect can be spectroscopically detected.

Multiple annular semiconductor electrodes 2 are situated on the top side of the semiconductor substrate 1 which concentrically surround the readout electrode A. Each of the individual semiconductor electrodes 2 is composed of a p-doped semiconductor material, whereby the doping of the semiconductor electrodes 2 is so strong that total depletion does not occur during operation. The semiconductor electrodes are also referred to as field rings R1 through Rn.

A first insulation layer Ox is provided on the top side of the semiconductor substrate 1 which leaves the readout electrode A and, optionally, parts of the semiconductor electrodes 2 open for production of electrical connections. A flat counterelectrode 3 is situated on the bottom side of the semiconductor substrate 1, opposite from the readout electrode A and the semiconductor electrodes 2. The counterelectrode 3 is composed of a p-doped semiconductor material, the doping being so strong that total depletion of the counterelectrode 3 does not occur during operation.

The individual semiconductor electrodes 2 are acted on from the center to the edge with an increasingly negative electrical potential, thereby forming the above-referenced electrical drift field inside the semiconductor substrate 1 which drives the electrons released through radiation in the semiconductor substrate 1 in the direction of the readout electrode A. The minima of the potential lines of the electron potential lie on a curve 4, along which the released electrons migrate toward the readout electrode A.

The semiconductor electrodes 2 are controlled by an integrated voltage divider (see left half of FIG. 1), comprising a chain of MOS enrichment transistors, for example, which is operated in the direction of passage. The width of the individual MOS enrichment transistors may be small compared to the circumference of the annular semiconductor electrodes 2. Each of the MOS enrichment transistors is formed by crossing a conductor between adjoining semiconductor electrodes 2, over the insulation layer Ox, which is situated on the top side of the semiconductor substrate 1, so that the voltage drops to approximately the threshold voltage of the transistor between the individual semiconductor electrodes 2. Alternatively, a resistive voltage divider or a punch-through structure may be provided for controlling the semiconductor electrodes.

The contacting of the readout electrode A with the conductor crossover according to the invention is described below. The readout electrode A is connected to a connecting conductor M which is outwardly guided over the annular semiconductor electrodes 2 to a bond pad B. Multiple intermediate electrodes L are located between the connecting conductor M and the semiconductor electrodes 2. The intermediate electrodes L are structured partial layers having a surface which in the radial direction completely covers the intermediate space between each pair of adjoining semiconductor electrodes, and in the transverse direction is at least as wide as the connecting conductor M. The radial extension of the intermediate electrodes L is preferably selected so that the semiconductor electrodes 2 overlap in a perpendicular projection, whereby the overlapping is two to three times, for example, the thickness of the insulation layer Ox. The semiconductor substrate 1 is electrically shielded by the intermediate electrode L in order to prevent charge carrier amplification or electrical breakthroughs in the semiconductor substrate 1 between the semiconductor electrodes 2 on account of the field effect of the connecting conductor M. An additional insulation layer I is present between the connecting conductor M and the individual intermediate electrodes L in order to insulate the connecting conductor M from the individual intermediate electrodes.

The individual intermediate electrodes L are each kept at a fixed electrical potential by electrically connecting each individual intermediate electrode L to one of the two adjoining semiconductor electrodes.

Lastly, the drift detector has an external electrode 5 which preferably is guided outwardly past the bond pad B.

Figure 2:
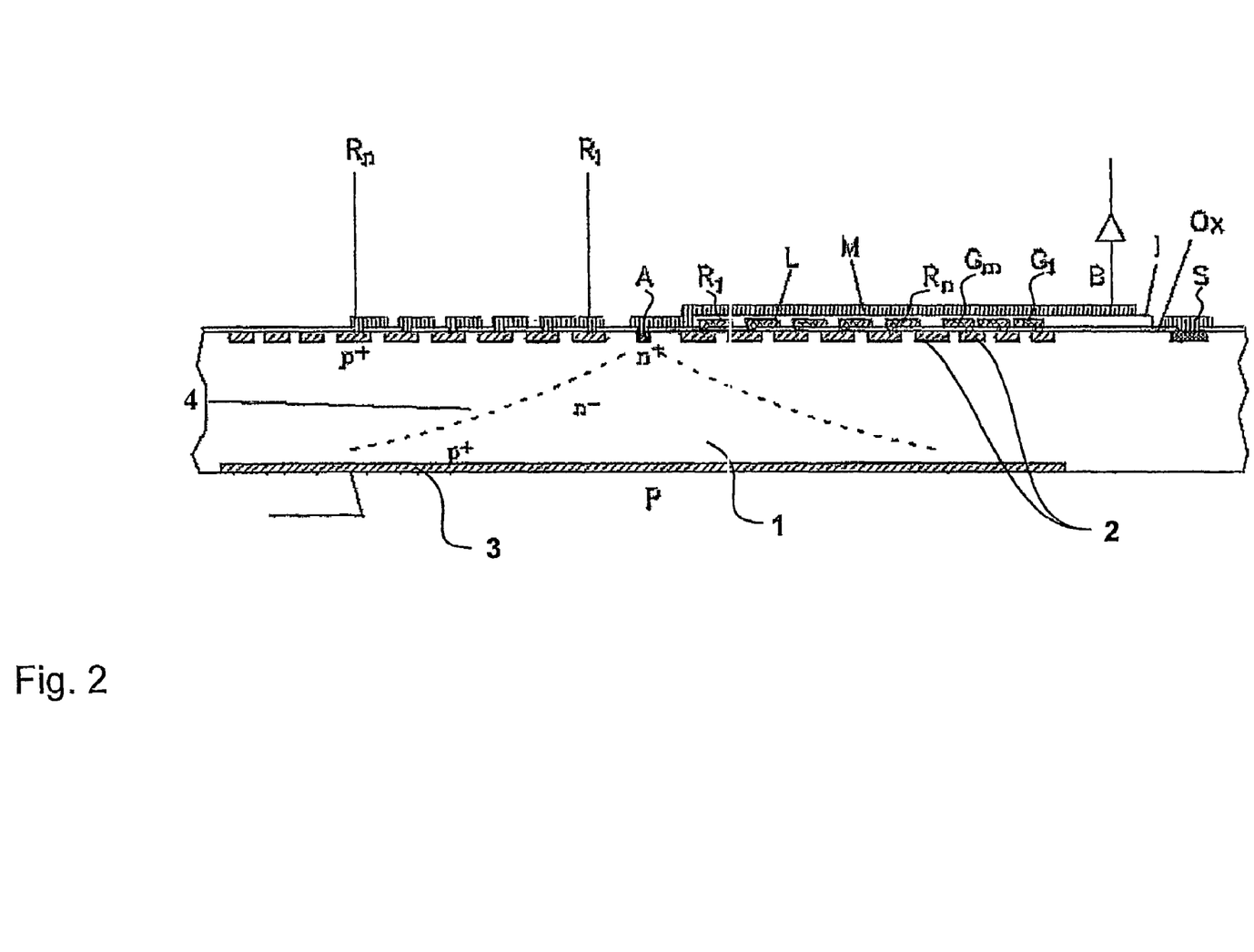
FIG. 2 shows an illustration of a detector with an alternative exemplary embodiment of a conductor crossover having additional shielding electrodes.
Figure 3:
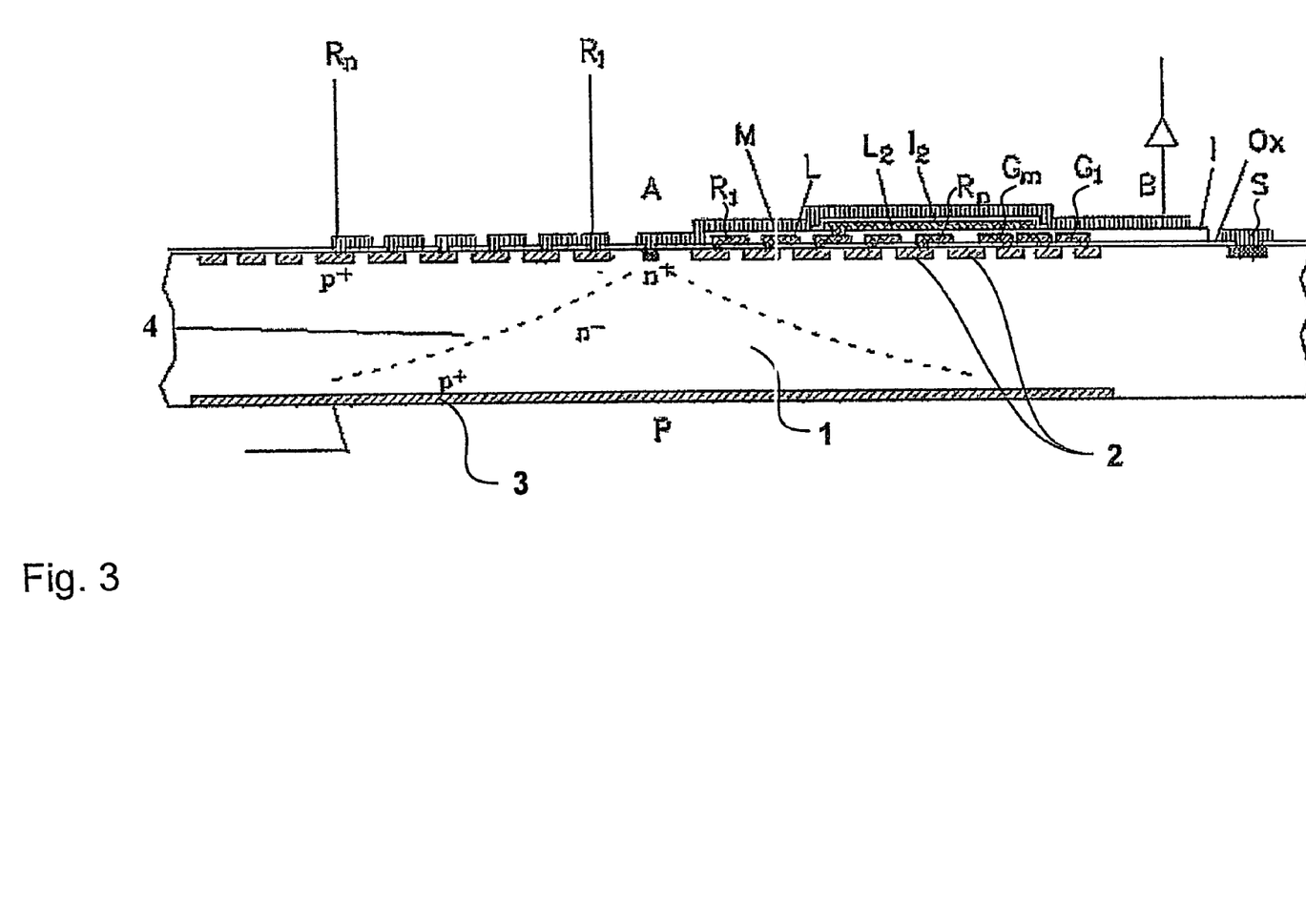
FIG. 3 shows an illustration of a detector with an alternative exemplary embodiment of a conductor crossover in which multiple levels of intermediate electrodes are superposed.

The exemplary embodiments of inventive conductor crossovers illustrated in FIGS. 2 and 3 are substantially similar to the exemplary embodiment described above, so that the same reference numbers are used for corresponding elements. To avoid repetition, reference is made to the description for FIG. 1.

The exemplary embodiment according to FIG. 2 is distinctive in that on the top side of the semiconductor substrate 1, in the outer region, multiple annular, concentrically arranged shielding electrodes $G_1$-$G_m$ are provided which are set at an electrical potential which outwardly decreases from the inside to the outside until the potential of a substrate electrode S is reached which determines the potential of the semiconductor substrate in the edge region.

The exemplary embodiment according to FIG. 3 is distinctive in that two levels of intermediate electrodes L, $L_2$ are situated between the connecting conductor M and the individual semiconductor electrodes 2. The multilayer arrangement of intermediate electrodes L, $L_2$ prevents disturbances of the detector function by the field of the connecting conductor M, even at very high voltages between the connecting conductor M and the semiconductor electrodes 2.

An additional insulation layer $I_2$ is situated between the connecting conductor M and the additional intermediate electrode L₂ in order to insulate the connecting conductor M from the intermediate electrode L₂.

Figure 4:
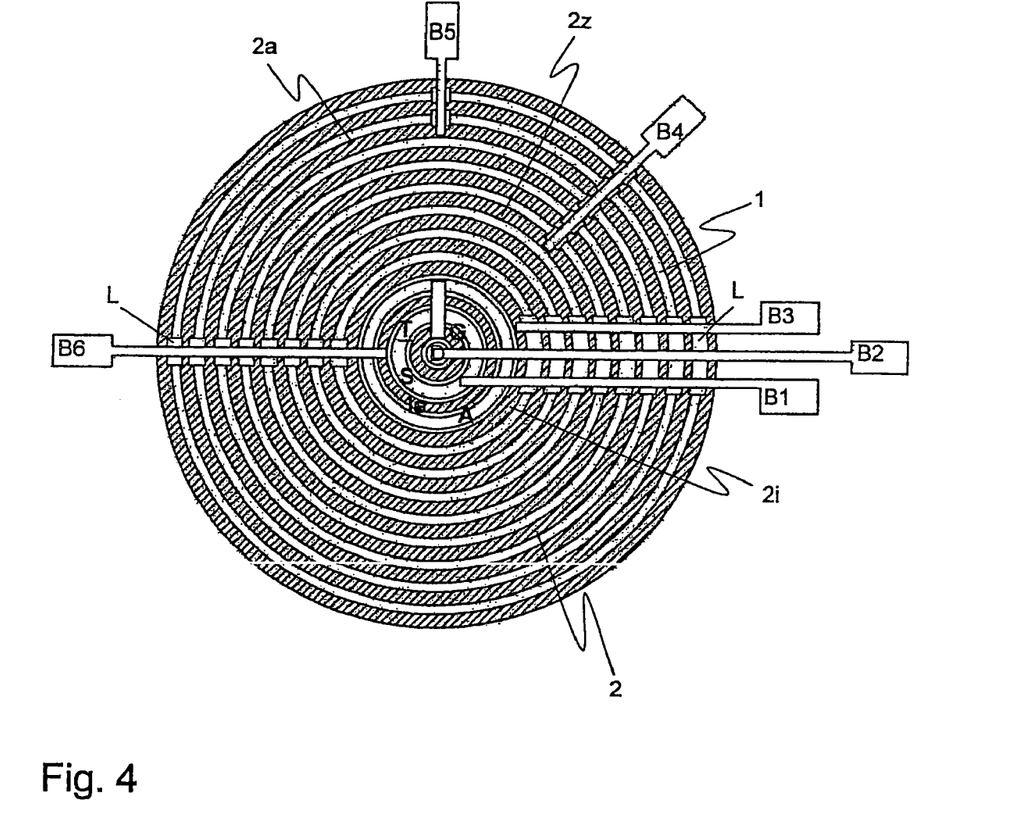
FIG. 4 shows a top view of a drift detector having multiple conductor crossovers according to the invention.

FIG. 4 shows a drift detector in top view, in which the readout electrode is integrated with a field effect transistor onto the semiconductor substrate. In the top view, the p-doped regions (semiconductor electrodes 2, 2a, 2z, 2i, gate G) are shaded, and the n-doped regions (free areas of semiconductor substrate 1, drain D, source S) are unshaded. The transistor Tr comprises the n-doped central drain region D, the p-doped annular gate region G, and the n-doped annular source region S. The gate region G is connected to the anode A (readout electrode). Each of the connection contacts of the transistor Tr is individually guided, using a conductor crossover according to the invention, to the outside edge of the drift detector. Furthermore, semiconductor electrodes 2 are connected as a group with conductor crossovers to external contact sites (bond pads). By use of the intermediate electrodes L according to the invention, connecting conductors may be shielded individually or in groups.

In the illustrated example, the bond pads B1 through B6 are correspondingly connected to the source S, drain D, the innermost semiconductor electrode 2i, an intermediate semiconductor electrode 2z, an external semiconductor electrode 2a, and a p-doped insulation ring Is between the source S and the anode A. The two outermost rings are shielding electrodes (guard electrodes) which are used to lower the voltage and which are not contacted. A substrate contact (not illustrated) is provided outside the outermost ring.

The invention is not limited to the above-described exemplary embodiment. Rather, a number of variants and modifications are conceivable which make use of the inventive concept and therefore likewise fall under the protection of the invention.

The invention claimed is:

1. In a multilayer semiconductor construction comprising at least one semiconductor detector and having a semiconductor substrate, at least two doped semiconductor electrodes situated on a first side of the semiconductor substrate, the improvement comprising:
   (a) a conductor crossover having at least one connecting conductor situated on and forming a part of the multilayer construction and electrically connected to an element of the multilayer semiconductor construction and extending from said element across the at least two doped semiconductor electrodes to a further electrical connection;
   (b) a first insulating layer provided on the first side of the semiconductor substrate; and
   (c) at least one intermediate electrode situated between said connecting conductor and said first insulation layer, said at least one intermediate electrode covering a region of said semiconductor substrate between said at least two doped semiconductor electrodes and electrically shielding said semiconductor substrate between said semiconductor electrodes.

2. The multilayer semiconductor construction according to claim 1, wherein the at least one intermediate electrode is electrically connected to at least one of the doped semiconductor electrodes and has the same electrical potential as the doped semiconductor electrode to which it is electrically connected.

3. The multilayer semiconductor construction according to claim 2, in which the connection between the intermediate electrode and the doped semiconductor electrode is formed by a polysilicon-silicon crossover.

4. The multilayer semiconductor construction according to claim 1, wherein the intermediate electrode is connected to an external power source to set its electrical potential.

5. The multilayer semiconductor construction according to one of claims 1, 2, 3 and 4, wherein the conductor crossover has multiple levels containing a plurality of insulated intermediate electrodes situated, one above the other, between the connecting conductor and the semiconductor substrate.

6. The multilayer semiconductor construction according to one of claims 1, 2, 3 and 4, comprising at least one additional connecting conductor, extending over adjoining doped semiconductor electrodes, and contacting at least one of the doped semiconductor electrodes.

7. The multilayer semiconductor construction according to one of claims 1, 2, 3 and 4, wherein the doped semiconductor electrodes are p-doped, and the semiconductor substrate is n-doped.

8. The multilayer semiconductor construction according one of claims 1, 2, 3 and 4, wherein the doped semiconductor electrodes are n-doped, and the semiconductor substrate is p-doped.

9. The multilayer semiconductor construction according to one of claims 1, 2, 3 and 4, wherein the semiconductor substrate is made essentially from one of the group consisting of silicon, polysilicon, germanium and gallium-arsenide.

10. The multilayer semiconductor construction according to one of claims 1, 2, 3 and 4, wherein the doped semiconductor electrodes, over which the connecting conductor extends, have an annular topology.

11. The multilayer semiconductor construction according to claim 10, wherein the connecting conductor extends over multiple doped semiconductor electrodes which mutually surround one another.

12. The multilayer semiconductor construction according to one of claims 1, 2, 3 and 4, wherein the at least one connecting conductor extends over multiple adjoining semiconductor detectors.

13. A drift detector for X-ray spectroscopy having at least one multilayer semiconductor construction according to one of claims 1, 2, 3 and 4.

14. A detector assembly for X-ray spectroscopy, comprising multiple drift detectors and having at least one multilayer semiconductor construction according to one of claims 1, 2, 3 and 4, the conductor crossover extending over at least two of the multiple drift detectors.

15. The multilayer semiconductor construction according to one of claims 1, 2, 3 and 4, comprising at least one additional connecting conductor, which extends over adjoining semiconductor electrodes to contact said element, an amplification element.

16. The multilayer semiconductor construction according to one of claims 1, 2, 3 and 4, additionally comprising a readout electrode, wherein the doped semiconductor electrodes are p-doped and the readout electrode is n-doped.

17. The multilayer semiconductor construction according to one of claims 1, 2, 3 and 4, wherein the doped semiconductor electrodes are made essentially from at least one of the group consisting of silicon, polysilicon, germanium and gallium-arsenide.

18. The multilayer semiconductor construction according to one of claims 1, 2, 3 and 4, additionally comprising a substrate electrode, wherein the substrate electrode is made essentially from at least one of the group consisting of silicon, polysilicon, germanium and gallium-arsenide.

19. The multilayer semiconductor construction according to claim 1, wherein the element of the multilayer semiconductor construction to which the connecting conductor is electrically connected is a readout electrode of the semiconductor detector.

20. The multilayer semiconductor construction according to claim 1, wherein the element of the multilayer semiconductor construction to which the connecting conductor is electrically connected is a transistor formed in the multilayer semiconductor construction.

21. The multilayer semiconductor construction according to claim 1, wherein the semiconductor substrate, the at least two doped semiconductor electrodes, the connecting conductor, the element to which the connecting conductor is electrically connected, the first insulating layer and the at least one intermediate electrode are integrated features of an integrated multilayer semiconductor structure.

22. The multilayer semiconductor construction according to claim 1, wherein the at least one intermediate electrode is located in a region of the multilayer semiconductor construction that lies under the connecting conductor between the connecting conductor and the semiconductor substrate and shielding the semiconductor substrate from the connecting conductor where the connecting conductor crosses the semiconductor substrate.

23. The multilayer semiconductor construction according to claim 22, wherein the at least one intermediate electrode comprises a plurality of intermediate electrodes completing a shielded path across the semiconductor substrate along which the connecting conductor extends.

* * * * *